(12) United States Patent
Li et al.

(10) Patent No.: US 9,716,110 B2
(45) Date of Patent: Jul. 25, 2017

(54) ARRAY SUBSTRATE, METHOD FOR MANUFACTURING THE SAME, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Tiansheng Li, Beijing (CN); Zhenyu Xie, Beijing (CN)

(73) Assignees: BOE TECHNOLOGY GROUP CO., LTD. (CN); BEIJING BOE OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 14/422,334

(22) PCT Filed: Jul. 9, 2014

(86) PCT No.: PCT/CN2014/081898
§ 371 (c)(1),
(2) Date: Feb. 18, 2015

(87) PCT Pub. No.: WO2015/043282
PCT Pub. Date: Apr. 2, 2015

(65) Prior Publication Data
US 2016/0013210 A1    Jan. 14, 2016

(30) Foreign Application Priority Data
Sep. 30, 2013   (CN) .......................... 2013 1 0462378

(51) Int. Cl.
*H01L 27/12*        (2006.01)

(52) U.S. Cl.
CPC ........ *H01L 27/124* (2013.01); *H01L 27/1218* (2013.01); *H01L 27/1248* (2013.01); *H01L 27/1262* (2013.01); *H01L 27/1288* (2013.01)

(58) Field of Classification Search
CPC ....................................................... H01L 27/124
(Continued)

(56) References Cited

U.S. PATENT DOCUMENTS 5,273,920 A * 12/1993 Kwasnick ........... H01L 21/3003
                                                                148/DIG. 1
2008/0191211 A1    8/2008 Yano et al.
(Continued)

FOREIGN PATENT DOCUMENTS

CN          202093289             12/2011
CN          202404339 U  *  8/2012 ........... G02F 1/1362
(Continued)

OTHER PUBLICATIONS

First Office Action issued in corresponding Chinese Application No. 201310462378.9 dated May 19, 2015.
(Continued)

*Primary Examiner* — Kenneth Parker
*Assistant Examiner* — Warren H Kilpatrick
(74) *Attorney, Agent, or Firm* — Brooks Kushman P.C.

(57) ABSTRACT

A method for manufacturing an array substrate which includes: depositing a gate metal film on a base substrate, and forming a first pattern including the gate electrode by a first patterning process; depositing a gate insulating film, a first transparent conductive film, a source/drain metal film and a doped a-Si film sequentially, and forming a second pattern including the pixel electrode, the source electrode, the drain electrode and a doped semiconductor layer by a second patterning process; depositing an a-Si film, and forming a third pattern including a TFT channel, the semi-
(Continued)

conductor layer and a gate insulating layer via-hole by a third patterning process; depositing a passivation layer film, and forming a fourth pattern including a passivation layer via-hole by a fourth patterning process, the passivation layer via-hole being arranged at a position corresponding to the gate insulating layer via-hole; and depositing a second transparent conductive film on the base substrate with the fourth pattern, and forming a fifth pattern including an electrical connector by a fifth patterning process.

12 Claims, 6 Drawing Sheets

(58) Field of Classification Search
 USPC .......................................................... 257/72
 See application file for complete search history.

(56) References Cited

U.S. PATENT DOCUMENTS

2009/0231310 A1* 9/2009 Tsai ...................... H01L 27/124
 345/205
2010/0295049 A1* 11/2010 Yoo ...................... H01L 27/1288
 257/59
2011/0013130 A1* 1/2011 Choi ................. G02F 1/134363
 349/141
2012/0153312 A1 6/2012 Chou
2014/0209913 A1* 7/2014 Song ..................... G02F 1/1362
 257/72

FOREIGN PATENT DOCUMENTS

| CN | 103035568 | 4/2013 |
| CN | 202948926 | 5/2013 |
| CN | 103489877 | 1/2014 |
| CN | 203480181 | 3/2014 |

OTHER PUBLICATIONS

International Search Report and Written Opinion issued in corresponding International Application No. PCT/CN2014/081898 dated Sep. 29, 2014.
European Search Report for European Application No. 14847683.1, Date of Completion Mar. 29, 2017, 9 Pages.

* cited by examiner

ARRAY SUBSTRATE, METHOD FOR MANUFACTURING THE SAME, AND DISPLAY DEVICE

CROSS-REFERENCE TO RELATED APPLICATION

This application is the U.S. national phase of PCT Application No. PCT/CN2014/081898 filed on Jul. 9, 2014, which claims a priority of the Chinese Patent Application No. 201310462378.9 filed on Sep. 30, 2013, the disclosures of which are incorporated in their entirety by reference herein.

TECHNICAL FIELD

The present disclosure relates to the field of display technology, in particular to an array substrate, a method for manufacturing the same and a display device.

BACKGROUND

A TFT-LCD (thin film transistor liquid crystal display) is a principal flat-panel display device. An existing array substrate includes gate lines, data lines, TFTs (thin film transistors) and pixel electrodes. The gate lines are arranged on a base substrate horizontally, the data lines are arranged on the base substrate longitudinally, and the TFTs, as active switch elements, are arranged at junctions between the gate lines and the data lines.

As shown in FIG. 1, the existing array substrate includes a gate electrode 10, a gate insulating layer 20, an active layer 30, a source electrode 50, a drain electrode 60, and a passivation layer 70, which are all arranged on a base substrate 80. The gate electrode 10 is formed with the gate lines integrally, the source electrode 60 and the drain electrode 60 are formed with the data lines integrally, and the drain electrode 60 is electrically connected to a pixel electrode 90. When an ON signal is inputted to the gate line, the active layer 30 will be electrically conductive, and a data signal from the data line will be transmitted from the source electrode 50 to the drain electrode 60 via a TFT channel 31, and finally to the pixel electrode 90. Upon the receipt of the signal, the pixel electrode 90 will form, together with a common electrode 91, an electric field for driving liquid crystals to rotate. Currently, in order to be adapted to a higher level of integration, a high PPI (pixels per inch) product has become a mainstream of the display device. However, more requirements shall be met when preparing the high PPI product, and seven patterning processes are desired to form structural patterns, so as to achieve the integration of GOA (Gate Driver on Array, which refers to a technique where gate driver ICs are directly manufactured on the array substrate so as to replace driver ICs made by external silicon wafers). Due to the application of the GOA technique, it is able to form the gate driver ICs at a periphery of a panel, so as to reduce the process steps, reduce the production cost, and enhance an integration level of the TFT-LCD panel, thereby to thin the panel and provide sufficiently small via-holes. Each patterning process includes such processes as exposing with a mask, developing, etching and removing, and the etching process includes both dry etching and wet etching. Hence, the number of patterning processes may be used to measure whether or not a method for manufacturing the TFT-LCD array substrate is complex, and a decrease in the number of patterning processes means a reduction in the production cost.

FIG. 3 shows the procedure for manufacturing the array substrate of a traditional TFT-LCD with an ADS mode. ADSDS (ADvanced Super Dimension Switch, ADS for short) is a wide viewing angle core technique for a planar electrical field system, and its features may be described as forming a multi-dimensional electric field by means of electrical fields generated at edges of slit electrodes within an identical plane and an electrical field generated between a slit electrode layer and a plate electrode layer, so as to enable all the liquid crystal molecules between the slit electrodes and right above the electrodes within a liquid crystal cell to rotate, thereby to improve the operational efficiency of the liquid crystal molecules and enhance the light transmission efficiency. ADS may be used to improve the image quality of a TFT-LCD product, and has such advantages as high resolution, high transmittance, low power consumption, wide viewing angle, high aperture ratio, low chromatic aberration and free of push Mura. At first, the gate lines are formed on a glass substrate by a first patterning process, and the gate insulating layer 20 and the active layer 30 are deposited, and a pattern of the active layer 30 is formed by a second patterning process. Next, the pixel electrode is deposited, and a pattern of the pixel electrode is formed by a third patterning process. A via-hole (GI via-hole) is formed in the gate insulating layer 20 by a fourth patterning process. A metal layer is then deposited, and patterns of a signal line and the active layer 30 are formed by a fifth patterning process. The signal line is connected to the gate line through the GI via-hole, and the patterns of the signal line and the active layer 30 are formed at a channel region. Then, the passivation layer (PVX) is deposited, and a passivation layer via-hole is formed by a sixth patterning process. Finally, a conductive layer is deposited, and the common electrode is formed by a seventh patterning process. Through the above seven masking processes, the structural patterns of the array substrate will be obtained.

As can be seen from the above, as to the existing method for manufacturing the TFT-LCD array substrate, when manufacturing the high PPI product including the GOA, seven masking processes are usually adopted due to such factors as high wiring density, thus it is unable to increase the yield. Moreover, as to the existing TFT LCD array substrate, the channels are formed by etching, and imperfect channels will be caused due to processes and devices used for the etching. These imperfect channels will occur frequently during the production, and the product quality will be adversely affected.

SUMMARY

An object of the present disclosure is to provide an array substrate, a method for manufacturing the same and a display device, so as to reduce the process steps and improve the product quality.

In one aspect, the present disclosure provides a method for manufacturing an array substrate. The array substrate includes a gate electrode, an active layer, a source electrode, a drain electrode and a pixel electrode, and the active layer includes a doped semiconductor layer and a semiconductor layer. The method includes:

Step 1: depositing a gate metal film on a base substrate, and forming a first pattern including the gate electrode by a first patterning process;

Step 2: depositing a gate insulating film, a first transparent conductive film, a source/drain metal film and a doped a-Si film sequentially on the base substrate with the first pattern, and forming a second pattern including the pixel electrode, the source electrode, the drain electrode and a doped semiconductor layer by a second patterning process;

Step 3: depositing an a-Si film on the base substrate with the second pattern, and forming a third pattern including a channel, the semiconductor layer and a gate insulating layer via-hole by a third patterning process, the gate insulating layer via-hole being arranged at a position corresponding to the gate electrode;

Step 4: depositing a passivation layer film on the base substrate with the third pattern, and forming a fourth pattern including a passivation layer via-hole by a fourth patterning process, the passivation layer via-hole being arranged at a position corresponding to the gate insulating layer via-hole; and Step 5: depositing a second transparent conductive film on the base substrate with the fourth pattern, and forming a fifth pattern including an electrical connector by a fifth patterning process, at least a portion of the electrical connector being located within the passivation layer via-hole and the gate insulating layer via-hole and configured to electrically connect the gate electrode and at least one of the source electrode and the drain electrode.

Further, Step 1 specifically includes:
providing the base substrate;
depositing the gate metal film on the base substrate;
coating a photoresist onto the gate metal film;
exposing and developing the photoresist with a mask, so as to at least reserve the photoresist at a position corresponding to the gate electrode;
etching off the gate metal which is not covered by the photoresist film by a first etching process; and
peeling off the remaining photoresist.

Further, Step 2 specifically includes:
depositing the gate insulating film, the first transparent conductive film, the source/drain metal film and the doped a-Si film sequentially on the base substrate with the first pattern;
coating a photoresist onto the doped a-Si film;
exposing and developing the photoresist with a dual-tone mask so as to form a photoresist totally-remained region corresponding to the source electrode and the drain electrode, a photoresist half-remained region corresponding to the pixel electrode, and a photoresist totally-removed region corresponding to the regions other than the photoresist totally-remained region and the photoresist half-remained region, the photoresist totally-removed region including regions corresponding to the TFT channel and the gate insulating layer via-hole;
etching off fully the first transparent conductive film, the source/drain metal film and the doped a-Si film at the photoresist totally-removed region by a second etching process;
removing the photoresist at the photoresist half-remained region by an ashing process, so as to uncover the doped a-Si film at the photoresist half-remained region;
etching off fully the doped a-Si film and the source/drain metal film at the photoresist half-remained region by a third etching process; and peeling off the remaining photoresist.

Further, Step 3 specifically includes:
depositing the a-Si film on the base substrate with the second pattern;
coating a photoresist onto the a-Si film;
exposing and developing the photoresist with a mask so as to reserve the photoresist at a position corresponding to the active layer and remove the photoresist at a position corresponding to the gate insulating layer via-hole;
etching off, by a fourth etching process, the a-Si film which is not covered by the photoresist, and etching the gate insulating layer at a position corresponding to the gate insulating layer via-hole by the fourth etching process; and
peeling off the remaining photoresist.

Further, Step 4 specifically includes:
depositing the passivation layer film on the base substrate with the third pattern;
coating a photoresist onto the passivation layer film;
exposing and developing the photoresist with a mask, and removing the photoresist at least at a position corresponding to the passivation layer via-hole, the passivation layer via-hole being arranged at a position corresponding to the gate insulating layer via-hole;
etching off, by a fifth etching process, the passivation layer film which is not covered by the photoresist; and
peeling off the remaining photoresist.

Further, Step 5 specifically includes:
depositing the second transparent conductive film on the base substrate with the fourth pattern;
coating a photoresist layer onto the second transparent conductive film; exposing and developing the photoresist with a mask so as to reserve the photoresist at least at a position corresponding to the passivation layer via-hole;
etching oft by a sixth etching process, the second transparent conductive film which is not covered by the photoresist; and
peeling off the remaining photoresist.

Further, in Step 5, a common electrode is also formed by the fifth patterning process while depositing the second transparent conductive film on the base substrate with the fourth pattern and forming the pattern including the electrical connector by the fifth patterning process. Step 5 specifically includes:
depositing the second transparent conductive film on the base substrate with the fourth pattern;
coating a photoresist onto the second transparent conductive film;
exposing and developing the photoresist with a mask so as to reserve the photoresist at least at positions corresponding to the common electrode and the passivation layer via-hole;
etching off the second transparent conductive film by the sixth etching process; and
peeling off the remaining photoresist.

In another aspect, the present disclosure provides an array substrate, including:
a base substrate;
a gate electrode formed on the base substrate;
a gate insulating layer formed on the gate electrode and covering the entire base substrate, a gate insulating layer via-hole being provided in the gate insulating layer and located above at least a portion of the gate electrode;
a pixel electrode formed on the gate insulating layer;
a first transparent conductive portion arranged at a layer where the pixel electrode is located;
a second transparent conductive portion arranged at a layer where the pixel electrode is located, the second transparent conductive portion and the first transparent conductive portion being located at both sides of the gate electrode, respectively;
a source electrode arranged on the first transparent conductive portion;
a drain electrode arranged on the second transparent conductive portion and at a layer where the source electrode is located, the source electrode and the drain electrode being arranged at both sides of the gate electrode, respectively, a TFT channel region being formed between a part of the source electrodes and the drain electrodes, and the gate insulating layer via-hole being arranged between the other part of the source electrodes and the drain electrodes;

a doped semiconductor layer formed on the source electrode and the drain electrode, respectively;

a semiconductor layer formed on the doped semiconductor layer, the semiconductor layer being merely arranged at a position corresponding to the drain electrode and the source electrode constituting the TFT channel region so as to form a TFT channel; and a passivation layer formed on the semiconductor layer, the passivation layer being provided with a passivation layer via-hole at a position corresponding to the gate insulating layer via-hole, the passivation layer via-hole being in communication with the gate insulating layer via-hole, and an electrical connector being provided within the passivation layer via-hole and the gate insulating layer via-hole so as to electrically connect the gate electrode and at least one of the source electrode and the drain electrode.

Further, the array substrate includes a common electrode formed on the passivation layer, and the common electrode is made of a material identical to the electrical connector and formed integrally with the electrical connector by a single patterning process.

Further, the array substrate includes a display region and a peripheral region around the display region. A portion of the gate electrode is located at the display region, and the other portion thereof is located at the peripheral region.

Further, the gate insulating layer via-hole is arranged above the gate electrode at the peripheral region or above the gate electrode at the display region.

In yet another aspect, the present disclosure provides a display device including the above-mentioned array substrate.

The array substrate and its manufacturing method of the present disclosure have the following advantages. As compared with an existing method for manufacturing a TFT-LCD array substrate, it is able to reduce the number of patterning processes, the process steps and the production cost, thereby to increase the yield. Moreover, the TFT channel is formed during the deposition of the semiconductor layer, and as compared with a traditional TFT channel formed by etching, it is able to fundamentally prevent the occurrence of imperfect TFT channels, thereby to significantly improve the product quality.

DETAILED DESCRIPTION

Figure 1:
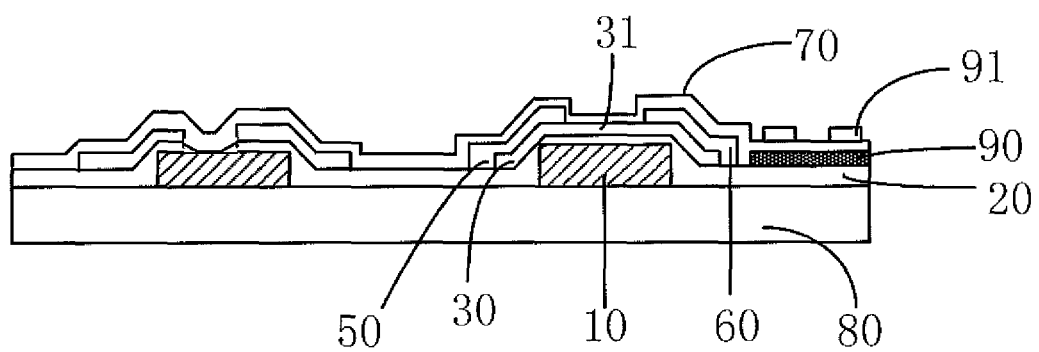
FIG. 1 is a sectional view of a traditional TFT-LCD array substrate.
Figure 2:
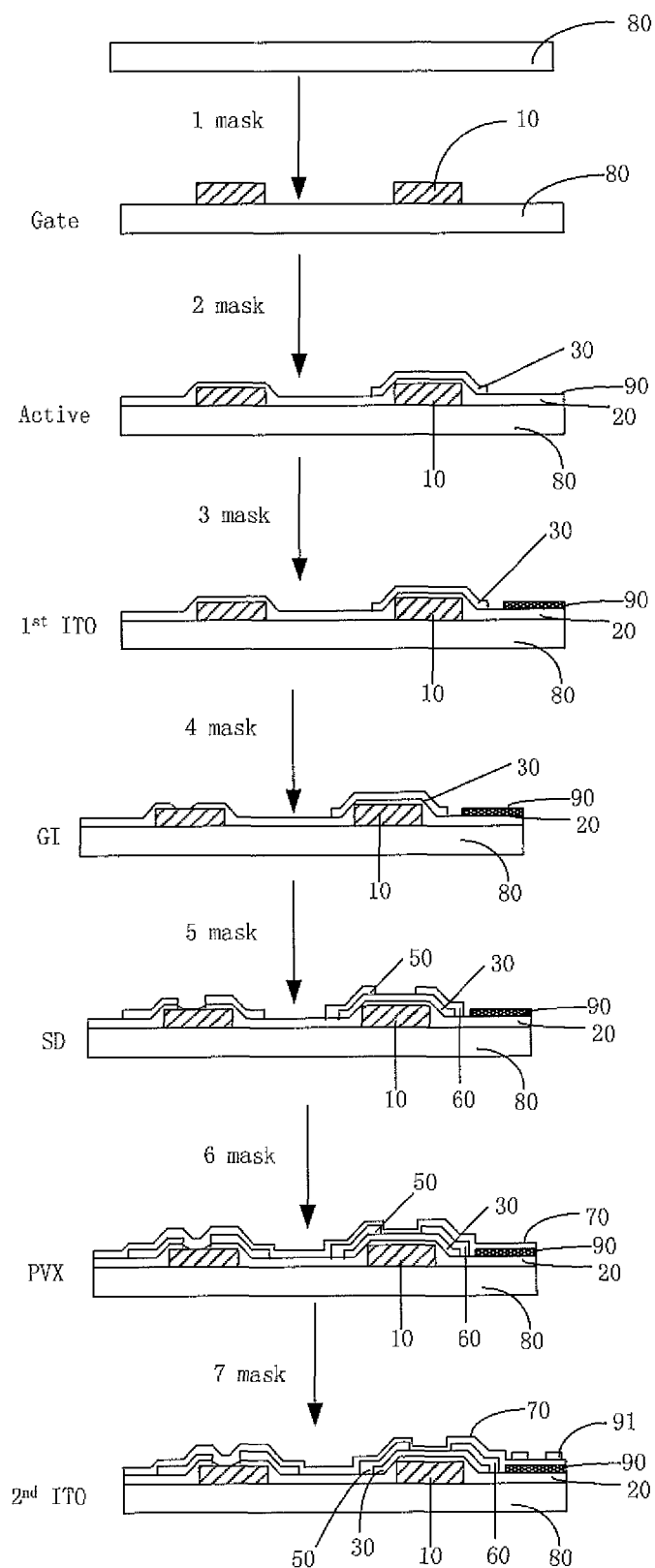
FIG. 2 is a schematic view showing the 7mask manufacture procedure for the traditional TFT-LCD array substrate.

The principles and features of the present disclosure will be described hereinafter in conjunction with the drawings and embodiments. The following embodiments are for illustrative purpose only, but shall not be used to limit the scope of the present disclosure.

It should be appreciated that, such expression as "X is arranged on Y" mentioned in the present disclosure means that X is arranged on, and meanwhile in contact with, Y. As shown in the drawings, a base substrate is arranged at the bottom. In the present disclosure, a patterning process includes such processes as photoresist coating, masking, exposing, developing, etching and photoresist removing, and a positive photoresist is taken as an example.

A TFT-LCD array substrate of the present disclosure mainly includes gate lines, data lines, TFTs and pixel electrodes. Pixel units are defined by the gate lines and the data lines perpendicular to each other, and the TFT and the pixel electrode are formed in each pixel unit. The gate line is configured to provide an ON signal to the TFT, the data line is configured to provide a data signal to the pixel electrode, and the TFT is an active switch element.

Figure 15:
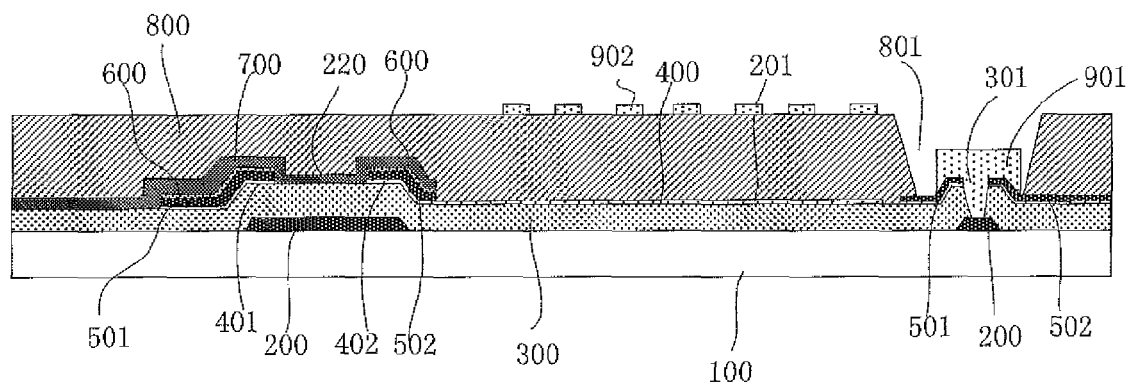
FIG. 15 is a sectional view of an array substrate according to an embodiment of the present disclosure.

FIG. 15 is a sectional view of the TFT-LCD array substrate according to an embodiment of the present disclosure. The TFT-LCD array substrate includes a display region and a peripheral region around the display region. As shown in FIG. 15, the array substrate includes:

a base substrate 100;

a gate electrode 200 formed on the base substrate 100, a portion of the gate electrode 200 being located at the display region of the array substrate and the other portion of the gate electrode 200 being located at the peripheral region of the array substrate;

a gate insulating layer 300 formed on the gate electrode 200 and covering the entire base substrate 100, a gate insulating layer via-hole 301 being provided in the gate insulating layer 300 and located above at least a portion of the gate electrode 200, e.g., the gate insulating layer via-hole 301 being arranged above the gate electrode 200 at the peripheral region;

a pixel electrode 400 formed on the gate insulating layer 300;

a first transparent conductive portion 401 arranged at a layer where the pixel electrode 400 is located;

a second transparent conductive portion 402 arranged at a layer where the pixel electrode 400 is located, the second transparent conductive portion 402 and the first transparent conductive portion 401 being located at both sides of the gate electrode 200, respectively;

a source electrode 501 arranged on the first transparent conductive portion 401;

a drain electrode 502 arranged on the second transparent conductive portion 402 and at a layer where the source electrode 501 is located, the source electrode 501 and the drain electrode 502 being arranged at both sides of the gate electrode 200, respectively, e.g., a part of the source electrodes 501 and the drain electrodes 502 being located at a TFT channel region formed at the display region of the array substrate, the other part of the source electrodes 501 and the drain electrodes 502 being located at the peripheral region of the array substrate and at both sides of the gate insulating layer via-hole 301;

a doped semiconductor layer 600 formed on the source electrode 501 and the drain electrode 502, respectively;

a semiconductor layer 700 formed on the doped semiconductor layer 600, the semiconductor layer 700 being arranged at a position corresponding to the drain electrode 502 and the source electrode 501, constituting the TFT channel region and being located at the display region, so as to form a TFT channel 220; and a passivation layer 800 formed on the semiconductor layer 700, the passivation layer 800 being provided with a passivation layer via-hole 801 at the peripheral region at a position corresponding to the gate insulating layer via-hole 301, the passivation layer via-hole 801 being in communication with the gate insulating layer via-hole 301, and an electrical connector 901 being provided within the passivation layer via-hole 801 and the gate insulating layer via-hole 301 and configured to electrically connect the gate electrode 200 and at least one of the source electrode 501 and the drain electrode 502.

In this embodiment, as shown in FIG. 15, the second transparent conductive portion 402 is formed integrally with the pixel electrode 400. In this way, the first transparent conductive portion 401, the second transparent conductive portion 402 and the pixel electrode 400 may be formed integrally by etching an identical transparent conductive layer through a single patterning process.

In this embodiment, as shown in FIG. 15, the array substrate further includes a common electrode 902 formed on the passivation layer 800. For an ADS panel, the common electrode 902 is also arranged on the array substrate, and it should be appreciated that, for the other kinds of panel, the common electrode may not be arranged on the array substrate either.

In this embodiment, as shown in FIG. 15, the common electrode 902 is made of a material identical to the electrical connector 901 and formed integrally with the electrical connector 901 by a single patterning process. Of course, during the actual application, the common electrode 902 and the electrical connector 901 may be made of different materials and formed by different patterning processes.

In this embodiment, as shown in FIG. 15, the source electrode 501 is of a shape matching that of the first transparent conductive portion 401, and the drain electrode 502 is of a shape matching that of the second transparent conductive portion 402.

According to the present disclosure, the source electrode 501 may be formed integrally with the first transparent conductive portion 401 thereunder by a single patterning process (a grayscale masking process), and the drain electrode 502 may be formed integrally with the second transparent conductive portion 402 thereunder by a single patterning process (a grayscale masking process).

In addition, in this embodiment, the array substrate further includes gate lines (not shown) and data lines (not shown). The gate lines are arranged at a layer, and made of a material, identical to the gate electrode 200, and they are formed integrally by a single patterning process. The data lines are arranged at a layer, and made of a material, identical to the source electrode 501 and the drain electrode 502, and they are formed integrally by a single patterning process.

It should be appreciated that, in this embodiment, a portion of the gate electrode 200 is located at the display region, the other portion thereof is located at the peripheral region, and the gate insulating layer via-hole 301 is arranged above the gate electrode 200 at the peripheral region. During the actual application, the gate insulating layer via-hole 301 may be arranged above the gate electrode 200 at the display region.

According to the TFT-LCD array substrate of the present disclosure, as compared with a traditional method for manufacturing the TFT-LCD array substrate where seven patterning processes are required, it is able to reduce the number of patterning processes, i.e., by two patterning processes, thereby to reduce the production cost and improve the yield. In addition, the TFT channel is formed during the deposition of the semiconductor layer 700 in the present disclosure, and as compared with a traditional TFT channel formed by etching, it is able to fundamentally prevent the occurrence of imperfect TFT channels, thereby to significantly improve the product quality.

In addition, the present disclosure provides a display device including the above-mentioned TFT-LCD array substrate.

In addition, the present disclosure provides a method for manufacturing the above-mentioned TFT-LCD array substrate, including:

Step 1: depositing a gate metal film on a base substrate, and forming a first pattern including a gate electrode 200 by a first patterning process;

Step 2: depositing a gate insulating film, a first transparent conductive film, a source/drain metal film and a doped a-Si film sequentially on the base substrate with the first pattern, and forming a second pattern including a pixel electrode 400, a source electrode 501, a drain electrode 502 and a doped semiconductor layer 600 by a second patterning process;

Step 3: depositing an a-Si film on the base substrate with the second pattern, and forming a third pattern including a TFT channel, a semiconductor layer 700 and a gate insulating layer via-hole 301 by a third patterning process, the gate insulating layer via-hole 301 being arranged at a position corresponding to the gate electrode 200;

Step 4: depositing a passivation layer film on the base substrate with the third pattern, and forming a fourth pattern including a passivation layer via-hole 801 by a fourth patterning process, the passivation layer via-hole 801 being arranged at a position corresponding to the gate insulating layer via-hole 301; and Step 5: depositing a second transparent conductive film on the base substrate with the fourth pattern, and forming a fifth pattern including an electrical connector 901 by a fifth patterning process, at least a portion of the electrical connector 901 being located within the passivation layer via-hole 801 and the gate insulating layer via-hole 301 and configured to electrically connect the gate electrode 200 and at least one of the source electrode 501 and the drain electrode 502.

Figure 3:
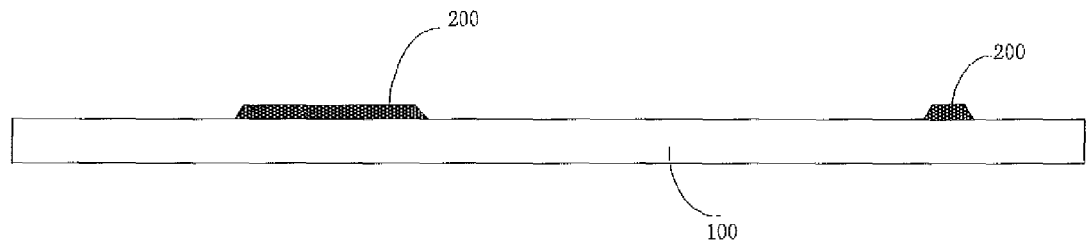
FIG. 3 is a sectional view of a base substrate after a gate electrode is formed by a first patterning process according to an embodiment of the present disclosure.
Figure 4:
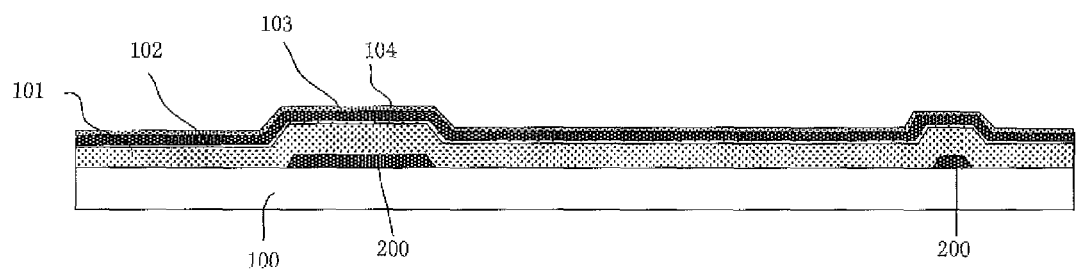
FIG. 4 is a sectional view of the base substrate with the first pattern after a gate insulating film, a first transparent conductive film, a source/drain metal film and a doped a-Si film are deposited sequentially according to an embodiment of the present disclosure.

FIGS. 3-4 show the procedures for manufacturing the TFT-LCD array substrate according to the present disclosure. The method for manufacturing the TFT-LCD array substrate will be specifically described hereinafter.

FIG. 3 is a sectional view of the base substrate after the gate electrode 200 is formed by the first patterning process. To be specific, the procedure of forming the gate electrode 200 on the base substrate by the first patterning process includes:

providing the base substrate 100;

depositing the gate metal film on the base substrate 100 by magnetron sputtering, thermal evaporation or any other film-forming method, wherein the gate metal film may be a single-layered film made of Mo, Al, an Al/Nd alloy, W, Cr and Cu and the like, or a multi-layered film consisting of layers made of these metals;

coating a photoresist onto the gate metal film;

exposing and developing the photoresist with a common mask, so as to reserve the photoresist at least at a position corresponding to the gate electrode 200;

etching off, by a first etching process, the gate metal film which is not covered by the photoresist, so as to form the first pattern including the gate electrode 200; and peeling off the remaining photoresist, so as to obtain the structure of the first pattern as shown in FIG. 3.

Through the above steps, the first patterning process is completed and the gate electrode 200 is formed on the base substrate 100.

It should be noted that, in the first patterning process, the photoresist may be reserved at a position corresponding to the gate line during the exposing and developing, so as to form the gate line after the gate metal film which is not covered by the photoresist is etched by the first etching process.

Figure 5:
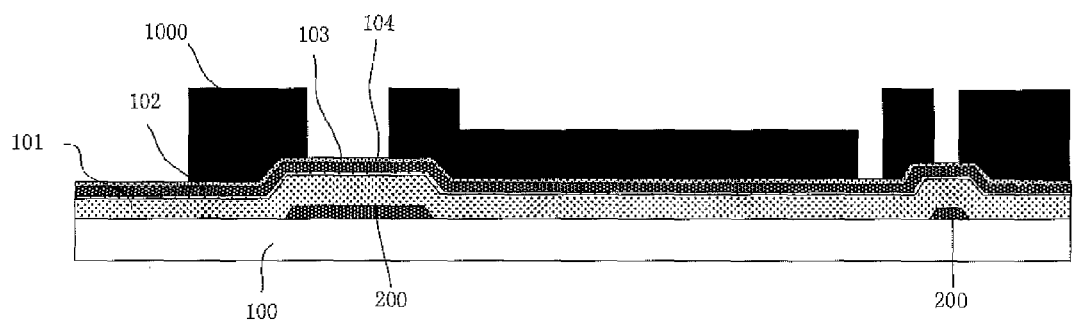
FIG. 5 is a sectional view of the structure in FIG. 4 after a photoresist is coated and then exposed and developed.
Figure 6:
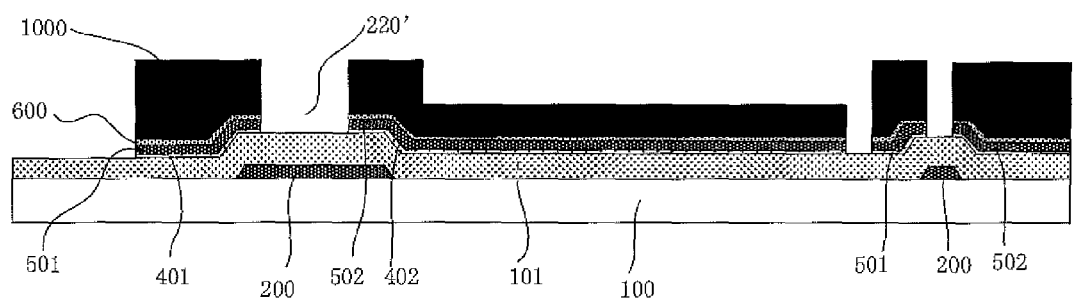
FIG. 6 is a sectional view of the structure in FIG. 5 after a second etching process.
Figure 7:
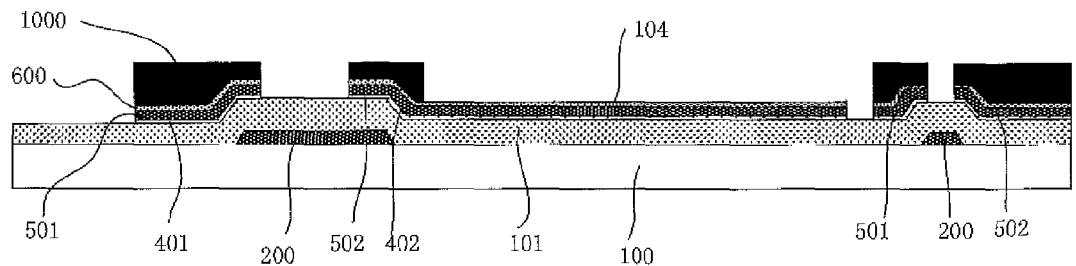
FIG. 7 is a sectional view of the structure in FIG. 6 after an ashing process.
Figure 8:
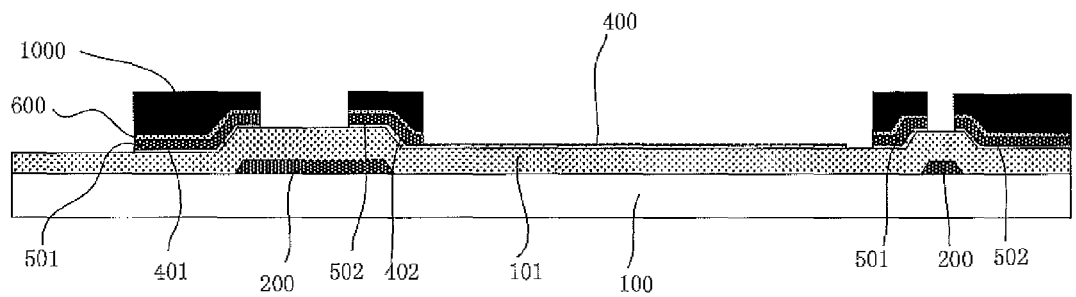
FIG. 8 is a sectional view of the structure in FIG. 7 after a third etching process.
Figure 9:
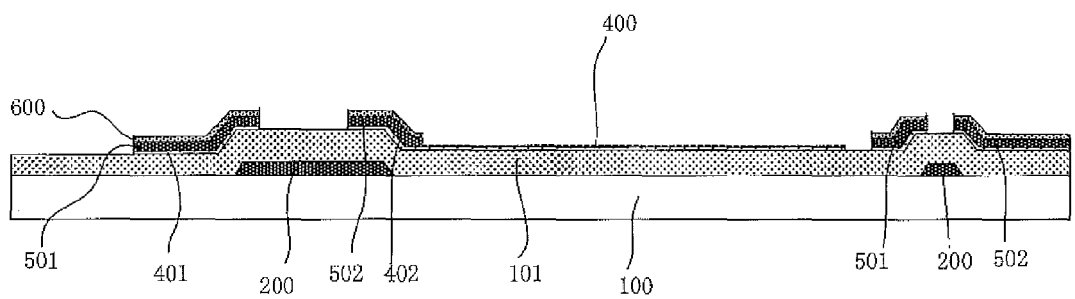
FIG. 9 is a sectional view of the structure in FIG. 8 after the remaining photoresist is removed.

FIG. 4 is a sectional view of the base substrate 100 with the first pattern after the gate insulating film, the first transparent conductive film, the source/drain metal film and the doped a-Si film are sequentially deposited, FIG. 5 is a sectional view of the structure in FIG. 4 after a photoresist is coated and then exposed and developed, FIG. 6 is a sectional view of the structure in FIG. 5 after a second etching process, FIG. 7 is a sectional view of the structure in FIG. 6 after an ashing process, FIG. 8 is a sectional view of the structure in FIG. 7 after a third etching process, and FIG. 9 is a sectional view of the structure in FIG. 8 after the remaining photoresist is removed.

Referring to FIGS. 4-9 and 15, the procedure of forming the pixel electrode 400, the source electrode 501, the drain electrode 502 and the doped semiconductor layer 600 on the base substrate 100 by the second patterning process includes the following steps.

At first, as shown in FIG. 4, the gate insulating film 101, the first transparent conductive film 102, the source/drain metal film 103 and the doped a-Si film 104 are sequentially deposited on the base substrate 100 (e.g., a glass or quartz substrate) by PECVD (plasma enhanced chemical vapor deposition), magnetron sputtering, thermal evaporation or any other film-forming method. The source/drain metal film may be a single-layered film made of Mo, Al, an Al/Nd alloy, W, Cr and Cu and the like, or a multi-layered film consisting of layers made of these metals. The first transparent conductive film 102 may be an ITO or IZO film.

Next, as shown in FIGS. 5 and 15, a photoresist 1000 is coated onto the doped a-Si film 104, and then exposed and developed with a dual-tone mask (or a half-tone or gray-tone mask) so as to form a photoresist totally-remained region corresponding to the source electrode 501 and the drain electrode 502, a photoresist half-remained region corresponding to the pixel electrode 400, and a photoresist totally-removed region corresponding to the regions other than the photoresist totally-remained region and the photoresist half-remained region. The photoresist 1000 is not present at positions corresponding to the TFT channel 220 and the gate insulating layer via-hole 301, i.e., the TFT channel 220 and the gate insulating layer via-hole 301 are located at the photoresist totally-removed region. The gate insulating layer via-hole may be arranged at the peripheral region of the array substrate, and the TFT channel may be arranged at the display region of the array substrate.

Next, as shown in FIGS. 5, 6 and 15, the first transparent conductive film 102, the source/drain metal film 103 and the doped a-Si film 104 at the photoresist totally-removed region are completely etched by the second etching process, so as to form the first transparent conductive portion 401, the second transparent conductive portion 402, the source electrode 501, the drain electrode 502 and the doped semiconductor layer 600, and form the TFT channel region 220' between the source electrode 501 and the drain electrode 502. In addition, the first transparent conductive film 102, the source/drain metal film 103 and the doped a-Si film 104 above the gate insulating layer 300 are removed at a position corresponding to the gate insulating layer via-hole 301. The second etching process may include both dry etching and wet etching. To be specific, the doped a-Si film (e.g., N+ a-Si) 104 may be etched using a gas such as $SF_6$, HCl, $Cl_2$ and He, the source/drain metal film 103 may be etched using an etchant obtained by mixing phosphoric acid with nitric acid, and the first transparent conductive film 102 (made of ITO or IZO) may be etched by an etchant such as sulfuric acid or peroxide.

Next, as shown in FIGS. 6, 7 and 15, the photoresist 1000 at the photoresist half-remained region is removed by an ashing process, so as to uncover the doped a-Si film 104 at the photoresist half-remained region, i.e., the doped a-Si film 104 at a position corresponding to the pixel electrode 400.

Then, as shown in FIGS. 7, 8 and 15, the source/drain metal film and the doped a-Si film at the photoresist half-remained region, i.e., the source/drain metal film and the doped a-Si film above the pixel electrode 400, are fully etched by the third etching process, so as to uncover the pixel electrode 400.

Finally, the remaining photoresist 1000 is removed, so as to obtain the structure with the second pattern in FIG. 9.

Through the above steps, the second patterning process is completed.

It should be appreciated that, in the second patterning process, the photoresist 1000 may also be reserved at a position corresponding to the data line during the exposing and developing, so that the first transparent conductive film 102, the source/drain metal film 103 and the doped a-Si film 104 are etched by the second etching process, thereby to form a pattern of the data line.

Figure 10:
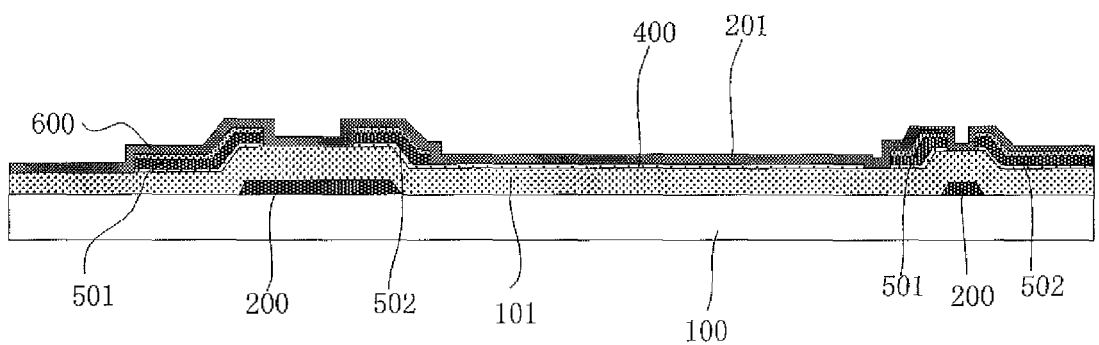
FIG. 10 is a sectional view of the base substrate with a second pattern after an a-Si film is deposited.
Figure 11:
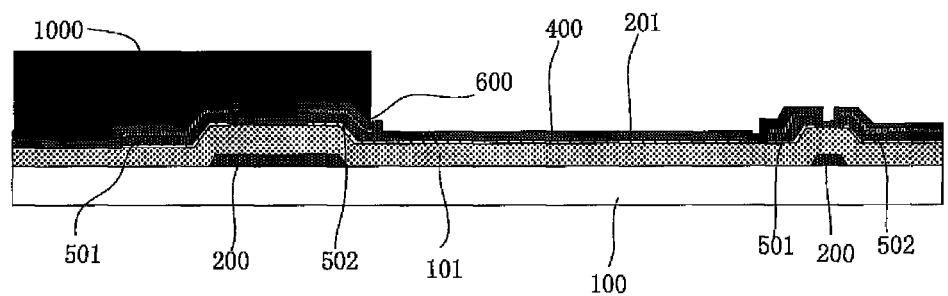
FIG. 11 is a sectional view of the structure in FIG. 10 after a photoresist is coated and then exposed and developed.
Figure 12:
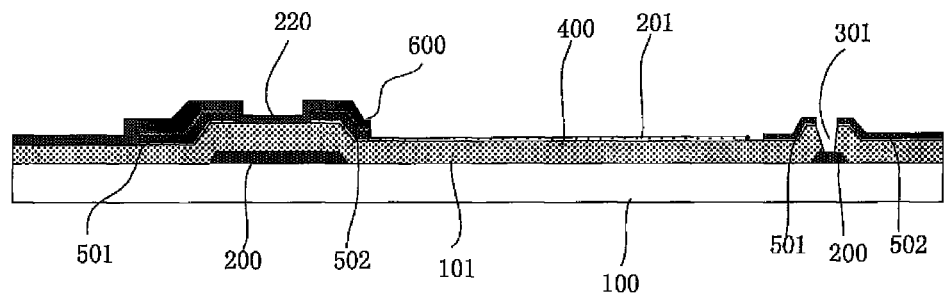
FIG. 12 is a sectional view of the structure in FIG. 11 after a fourth etching process is performed and the remaining photoresist is removed.

FIG. 10 is a sectional view of the base substrate 100 with the second pattern after the a-Si film is deposited, FIG. 11 is a sectional view of the structure in FIG. 10 after the photoresist 1000 is coated and then exposed and developed, and FIG. 12 is a sectional view of the structure in FIG. 11 after a fourth etching process is performed and the remaining photoresist 1000 is removed.

Referring to FIGS. 10, 12 and 15, the procedure of forming the TFT channel 220, the semiconductor layer 700 and the gate insulating layer via-hole 301 on the base substrate 100 by the third patterning process includes the following steps.

At first, as shown in FIGS. 10 and 15, usually the a-Si film 201 may be deposited by PECVD or any other film-forming method. After the deposition, the a-Si film 201 is deposited on the doped semiconductor layer 600 at positions corresponding to the data line, the source electrode 501 and the drain electrode 502, on the pixel electrode 400 at a position corresponding to the pixel electrode 400, and on the gate insulating layer 300 at the other regions (including positions corresponding to the TFT channel 220 and the gate insulating layer via-hole 301).

Next, as shown in FIGS. 10, 11 and 15, the photoresist 1000 is coated onto the a-Si film 201, and then exposed and developed with a common mask, so that the photoresist 1000 covers a region corresponding to the semiconductor layer 700 but it is not present at the other regions. For example, as shown in FIGS. 11 and 15, the photoresist 1000 merely covers regions corresponding to the TFT channel region 220 as well as the source electrode 501 and the drain electrode 502 at both sides at the display region of the array substrate, but it is not present at regions corresponding to the gate insulating layer via-hole as well as the source electrode 501 and the drain electrode 502 at the peripheral region of the array substrate.

Then, as shown in FIGS. 11, 12 and 15, the a-Si film 201 not covered by the photoresist 1000 is etched by a fourth etching process, so as to form a pattern of the semiconductor layer 700. In addition, the gate insulating layer 300 is etched by the fourth etching process at a position corresponding to the gate insulating layer via-hole 301, so as to form the gate insulating layer via-hole 301. The semiconductor layer 700 is formed on the TFT channel as well as the source electrode 501 and the drain electrode 502 at both sides at the display region, and the semiconductor layer 700 on the TFT channel region forms the TFT channel 220. In this way, the TFT channel is directly formed by depositing the a-Si film 201 without an additional etching step, and as a result, it is able to prevent the imperfect TFT channels due to the etching. Moreover, after the semiconductor layer 700 is etched, the gate insulating layer 300 may be etched using the relationship between an etching rate and a selection ratio (i.e., a process condition where an etching rate of etching a protective layer of the gate electrode 200 is far larger than an etching rate of etching a metal of the data line), so as to form the gate insulating layer via-hole 301, without etching, or rarely, the metal of the data line.

Finally, the remaining photoresist 1000 is removed, so as to obtain the structure with the third pattern in FIG. 12.

Figure 13:
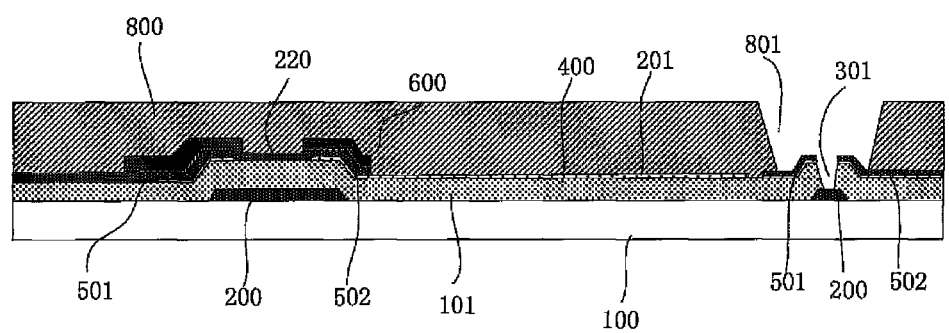
FIG. 13 is a sectional view of the structure in FIG. 12 after a fourth patterning process.

FIG. 13 is a sectional view of the structure in FIG. 12 after a fourth patterning process. To be specific, the procedure of forming the passivation layer 800 by the fourth patterning process includes the following steps.

At first, the passivation layer film is deposited on the entire base substrate 100 by PECVD or any other film-forming method, so as to form the passivation layer 800. The passivation layer film may be a single-layered film made of $SiN_x$, $SiO_x$ or $SiO_xN_y$, or a multi-layered film consisting of layers made of these materials.

Next, a photoresist is coated onto the passivation layer film.

Next, the photoresist is exposed and developed with a mask, and the photoresist is removed at least at a position corresponding to the passivation layer via-hole 801. The passivation layer via-hole 801 is located at a position corresponding to the gate insulating layer via-hole 301.

Then, the passivation layer film which is not covered by the photoresist is etched by a fifth etching process, so as to form the passivation layer via-hole 801 in communication with the gate insulating layer via-hole 301.

Finally, the remaining photoresist is removed, so as to obtain the structure of the fourth pattern including the passivation layer 800 as shown in FIG. 13.

Figure 14:
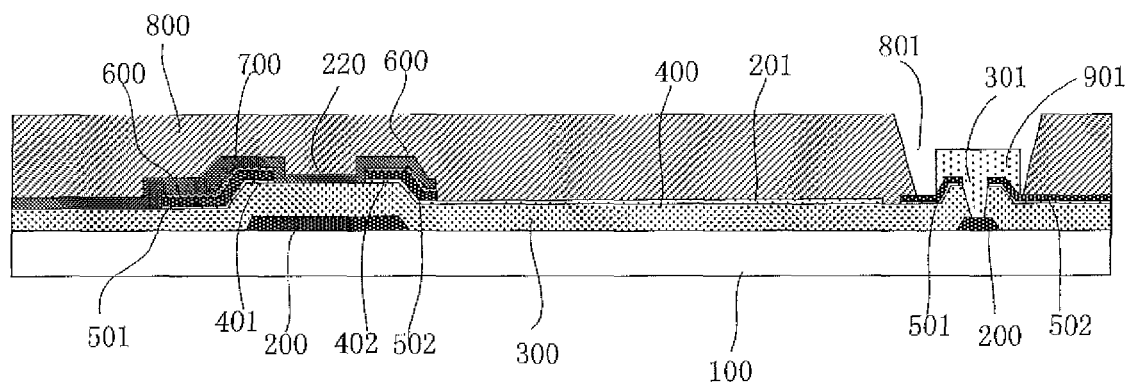
FIG. 14 is a sectional view of the structure in FIG. 13 after a fifth patterning process.

FIG. 14 is a sectional view of the structure in FIG. 13 after a fifth patterning process. To be specific, the procedure of forming the electrical connector 901 by the fifth patterning process includes the following steps.

At first, the second transparent conductive film is deposited on the base substrate 100 with the fourth pattern. The second transparent conductive film may be made of ITO or IZO.

Next, a photoresist is coated onto the second transparent conductive film

Next, the photoresist is exposed and developed with a common mask, so as to reserve the photoresist at least at a position corresponding to the passivation layer via-hole 801.

Then, the second transparent conductive film which is not covered by the photoresist is etched by a sixth etching process, so as to form the electrical connector 901 at the passivation layer via-hole 801.

Finally, the remaining photoresist is removed, so as to obtain the TFT-LCD array substrate of the present disclosure.

It should be appreciated that, for the array substrate with the ADS mode, when forming the electrical connector 901, the photoresist may be reserved at a position corresponding to the common electrode 902 during the exposing and developing, and then the common electrode 902 may be formed on the passivation layer 800 by the sixth etching process simultaneously, so as to obtain the structure as shown in FIG. 15.

As mentioned above, the TFT-LCD array substrate of the present disclosure will be obtained through five patterning processes.

The above are merely the preferred embodiments of the present disclosure. It should be appreciated that, a person skilled in the art may make further improvements and modifications without departing from the principle of the present disclosure, and these improvements and modifications shall also fall within the scope of the present disclosure.

What is claimed is:

1. A method for manufacturing an array substrate, the array substrate comprising a gate electrode, an active layer, a source electrode, a drain electrode and a pixel electrode, the method comprising:
   Step 1: depositing a gate metal film on a base substrate, and forming a first pattern including the gate electrode by a first patterning process;
   Step 2: depositing a gate insulating film, a first transparent conductive film, a source/drain metal film and a doped a-Si film sequentially on the base substrate with the first pattern, and forming a second pattern including the pixel electrode, the source electrode, the drain electrode and a doped semiconductor layer by a second patterning process;
   Step 3: depositing an a-Si film on the base substrate with the second pattern, and forming a third pattern including a TFT channel, the semiconductor layer and a gate insulating layer via-hole by a third patterning process, the gate insulating layer via-hole being arranged at a position corresponding to the gate electrode;
   Step 4: depositing a passivation layer film on the base substrate with the third pattern, and forming a fourth pattern including a passivation layer via-hole by a fourth patterning process, the passivation layer via-hole being arranged at a position corresponding to the gate insulating layer via-hole; and Step 5: depositing a second transparent conductive film on the base substrate with the fourth pattern, and forming a fifth pattern including an electrical connector by a fifth patterning process, at least a portion of the electrical connector being located within the passivation layer via-hole and the gate insulating layer via-hole and configured to electrically connect the gate electrode, the source electrode and the drain electrode which are arranged at the peripheral region, wherein the array substrate comprises a display region and a peripheral region around the display region, a portion of the gate electrode is located at the display region, the other portion of the gate electrode is located at the peripheral region, and the gate insulating layer via-hole is arranged above the gate electrode at the peripheral region.

2. The method according to claim 1, wherein Step 1 comprises:
providing the base substrate;
depositing the gate metal film on the base substrate;
coating a photoresist onto the gate metal film;
exposing and developing the photoresist with a mask, so as to at least reserve the photoresist at a position corresponding to the gate electrode;
etching off, by a first etching process, the gate metal film which is not covered by the photoresist; and
peeling off the remaining photoresist.

3. The method according to claim 1, wherein Step 2 comprises:
depositing the gate insulating film, the first transparent conductive film, the source/drain metal film and the doped a-Si film sequentially on the base substrate with the first pattern;
coating a photoresist onto the doped a-Si film;
exposing and developing the photoresist with a dual-tone mask so as to form a photoresist totally-remained region corresponding to the source electrode and the drain electrode, a photoresist half-remained region corresponding to the pixel electrode, and a photoresist totally-removed region corresponding to the regions other than the photoresist totally-remained region and the photoresist half-remained region, the photoresist totally-removed region including regions corresponding to the TFT channel and the gate insulating layer via-hole;
etching off fully the first transparent conductive film, the source/drain metal film and the doped a-Si film at the photoresist totally-removed region by a second etching process;
removing the photoresist at the photoresist half-remained region by an ashing process, so as to uncover the doped a-Si film at the photoresist half-remained region;
etching off fully the doped a-Si film and the source/drain metal film at the photoresist half-remained region by a third etching process; and
peeling off the remaining photoresist.

4. The method according to claim 1, wherein Step 3 comprises:
depositing the a-Si film on the base substrate with the second pattern;
coating a photoresist onto the a-Si film;
exposing and developing the photoresist with a mask so as to reserve the photoresist at a position corresponding to the active layer and remove the photoresist at a position corresponding to the gate insulating layer via-hole;
etching off, by a fourth etching process, the a-Si film which is not covered by the photoresist, and etching the gate insulating layer at a position corresponding to the gate insulating layer via-hole by the fourth etching process; and
peeling off the remaining photoresist.

5. The method according to claim 1, wherein Step 4 comprises:
depositing the passivation layer film on the base substrate with the third pattern;
coating a photoresist onto the passivation layer film;
exposing and developing the photoresist with a mask, and removing the photoresist at least at a position corresponding to the passivation layer via-hole, the passivation layer via-hole being arranged at a position corresponding to the gate insulating layer via-hole;
etching off, by a fifth etching process, the passivation layer film which is not covered by the photoresist; and
peeling off the remaining photoresist.

6. The method according to claim 1, wherein Step 5 comprises:
depositing the second transparent conductive film on the base substrate with the fourth pattern;
coating a photoresist layer onto the second transparent conductive film;
exposing and developing the photoresist with a mask so as to reserve the photoresist at least at a position corresponding to the passivation layer via-hole;
etching off, by a sixth etching process, the second transparent conductive film which is not covered by the photoresist; and
peeling off the remaining photoresist.

7. The method according to claim 1, wherein
in Step 5, a common electrode is also formed by the fifth patterning process while depositing the second transparent conductive film on the base substrate with the fourth pattern and forming the pattern including the electrical connector by the fifth patterning process.

8. The method according to claim 7, wherein Step 5 further comprises:
depositing the second transparent conductive film on the base substrate with the fourth pattern;
coating a photoresist onto the second transparent conductive film;
exposing and developing the photoresist with a mask so as to reserve the photoresist at least at positions corresponding to the common electrode and the passivation layer via-hole;
etching off the second transparent conductive film by the sixth etching process; and
peeling off the remaining photoresist.

9. An array substrate, comprising:
a base substrate;
a gate electrode formed on the base substrate;
a gate insulating layer formed on the gate electrode and covering the entire base substrate, a gate insulating layer via-hole being provided in the gate insulating layer and located above at least a portion of the gate electrode;
a pixel electrode formed on the gate insulating layer;
a first transparent conductive portion arranged at a layer where the pixel electrode is located;
a second transparent conductive portion arranged at a layer where the pixel electrode is located, the second transparent conductive portion and the first transparent conductive portion being located at both sides of the gate electrode, respectively;

a source electrode arranged on the first transparent conductive portion;

a drain electrode arranged on the second transparent conductive portion and at a layer where the source electrode is located, the source electrode and the drain electrode being arranged at both sides of the gate electrode, respectively, a TFT channel region being formed between a part of the source electrodes and the drain electrodes, and the gate insulating layer via-hole being arranged between the other part of the source electrodes and the drain electrodes;

a doped semiconductor layer formed on the source electrode and the drain electrode, respectively;

a semiconductor layer formed on the doped semiconductor layer, the semiconductor layer being merely arranged at a position corresponding to the drain electrode and the source electrode constituting the TFT channel region, so as to form a TFT channel; and a passivation layer formed on the semiconductor layer, the passivation layer being provided with a passivation layer via-hole at a position corresponding to the gate insulating layer via-hole, the passivation layer via-hole being in communication with the gate insulating layer via-hole, and an electrical connector being provided within the passivation layer via-hole and the gate insulating layer via-hole and configured to electrically connect the gate electrode, the source electrode and the drain electrode which are arranged at the peripheral region, wherein the array substrate comprises a display region and a peripheral region around the display region, a portion of the gate electrode is located at the display region, the other portion of the gate electrode is located at the peripheral region, and the gate insulating layer via-hole is arranged above the gate electrode at the peripheral region.

10. The array substrate according to claim 9, further comprising a common electrode formed on the passivation layer, wherein the common electrode is made of a material identical to the electrical connector and formed integrally with the electrical connector by a single patterning process.

11. A display device comprising the array substrate according to claim 9.

12. The display device according to claim 11, further comprising a common electrode formed on the passivation layer, wherein the common electrode is made of a material identical to the electrical connector and formed integrally with the electrical connector by a single patterning process.

* * * * *